United States Patent [19]

Biswas

[11] Patent Number: 5,907,857
[45] Date of Patent: May 25, 1999

[54] REFRESH-AHEAD AND BURST REFRESH PREEMPTION TECHNIQUE FOR MANAGING DRAM IN COMPUTER SYSTEM

[75] Inventor: Sukalpa Biswas, Sunnyvale, Calif.

[73] Assignee: Opti, Inc.

[21] Appl. No.: 08/831,261

[22] Filed: Apr. 7, 1997

[51] Int. Cl.[6] ................................................. G06F 12/16
[52] U.S. Cl. ......................................... 711/106; 365/222
[58] Field of Search .............................. 711/106; 365/222

[56] References Cited

U.S. PATENT DOCUMENTS

| | | | |
|---|---|---|---|
| 4,406,013 | 9/1983 | Reese et al. | 377/29 |
| 4,625,301 | 11/1986 | Berger | 365/222 |
| 4,691,303 | 9/1987 | Churchward et al. | 365/222 |
| 4,965,722 | 10/1990 | Tokuume | 711/106 |
| 4,984,209 | 1/1991 | Rajaram et al. | 365/222 |
| 5,345,574 | 9/1994 | Sakurada et al. | 711/115 |
| 5,418,920 | 5/1995 | Kuddes | 711/106 |
| 5,430,680 | 7/1995 | Parris | 365/222 |
| 5,487,172 | 1/1996 | Hyatt | 395/800.32 |
| 5,630,163 | 5/1997 | Fung et al. | 395/307 |
| 5,649,161 | 7/1997 | Andrade et al. | 711/167 |

OTHER PUBLICATIONS

Intel Corporation, "82359 Dram Controller", Preliminary Datasheet (Oct. 1991), pp. 512, 557–562.

Intel Corporation,, "82434LX/82434NX PCI, Cache and Memory Controller (PCMC)", Advance Information (Mar. 1994), published in "82430 PCIset Cache/Memory Subsystem", pp. 130–133, 142–144.

Samsung Electronics, "KM44V1004C/CL/CLL, CMOS DRAM" (1995), pp. 296–305.

*Primary Examiner*—John W. Cabeca
*Assistant Examiner*—Felix B. Lee
*Attorney, Agent, or Firm*—Fliesler, Dubb, Meyer & Lovejoy LLP

[57] ABSTRACT

A computer system refreshes dynamic memory in a burst, but allows other memory access requests to preempt a burst refresh before the burst completes. In another aspect, once a burst refresh begins, it is allowed to continue for a number of refresh cycles which is greater than the number of refresh cycles then due; that is, until a time when the number of refresh cycles due is negative. This technique, referred to herein as "refresh-ahead", effectively helps to shift memory refresh activity into periods of bus time which would otherwise be idle.

19 Claims, 10 Drawing Sheets

REFRESH-AHEAD AND BURST REFRESH PREEMPTION TECHNIQUE FOR MANAGING DRAM IN COMPUTER SYSTEM

BACKGROUND OF THE INVENTION

1. Field of the Invention

The invention relates to techniques for refreshing dynamic memory, and more particularly, techniques for managing such refreshes in order to minimize the impact on throughput.

2. Description of Related Art

Main memory in a computer system is typically, today, made up of dynamic random access memory (DRAM) chips organized into one or more banks. DRAM is available in several different variations, including page mode DRAMs, extended-data-out (EDO) DRAMs, burst-extended-data-out (BEDO) DRAMS, synchronous DRAMs (SDRAM), and so on. DRAM differs from static random access memory (SRAM) in that in DRAM, data is stored in a cell in the form of capacitive charge. This capacitive charge leaks over time, and therefore must be periodically read and rewritten to bring the charge back to its original level. The process of periodically reading and rewriting data into the memory is known as "refresh". A memory is referred to herein as "dynamic" as long as it requires periodic refresh; it need not be a random access memory.

The refresh rate of a particular type of DRAM is specified by the manufacturer. For example, the data sheet for the Samsung KMV1004C 4 Mb EDO DRAM specifies that all cells are to be refreshed at least once every 16 mS. Samsung Electronics, "KMV1004C/CL/CLL CMOS DRAM", Data Sheet (1995), incorporated by reference herein. This DRAM is organized internally as four bit-planes of 1024 rows of 1024 cells each, and the cells are refreshed a row at a time. The same row in all four bit planes are refreshed in parallel so 4096 cells are refreshed at once. Thus, for this DRAM, 1024 refresh cycles are required every 16 milliseconds. Stated another way, this DRAM requires one refresh cycle on average every 15.625 microseconds, with no row remaining unrefreshed for longer than 16 milliseconds. As used herein, this DRAM is said to require a "nominal" refresh rate no slower than one row every 15.625 microseconds.

In a typical computer system, main memory is organized into one or more banks containing consecutive, or at least distinct, row address ranges. Within a bank, multiple DRAM chips are connected in parallel (horizontally) to achieve the desired data path width, and vertically to achieve the desired row address range for the bank. All of the DRAM chips in a given bank of memory share the same row address strobe, and a "refresh row" is defined as all of the bit cells in a bank which are refreshed in a single refresh cycle.

Each bank of DRAM in a typical system has a command input port, an address input port and a bi-directional data port. The command input port carries signals which command the memory to read data from the memory onto the data port, write data from the data port into memory, strobe in a new column address and/or row address, perform a refresh, and so on. For fast page mode DRAMs and EDO DRAMs, for example, the command port includes a row address strobe (RAS#) signal line and a column address strobe (CAS#) signal line. All banks typically share the same CAS# signal, but have separate RAS# signals. For read or write accesses to the memory, a memory controller drives a row address onto the memory address lines, and asserts the RAS# signal for the desired bank of memory. It then drives a column address onto the memory address lines, and asserts CAS#. Depending on the state of a third signal, R/W#, the memory will read or write data, from or to the cell identified by the row and column addresses most recently specified. Because the memory has a page mode, if the memory controller desires to access other cells within the same row (also called "page"), it may do so simply by negating and reasserting the CAS# signal with a new column address on the memory address lines. As long as the RAS# signal remains active, the memory controller need not repeat the row address on the memory address lines.

Different systems performs refresh operations in different ways. Some systems refresh the memory by explicitly reading and rewriting each row of the memory within the required time frame. Many DRAMs also support a "CAS#-before-RAS#" (CBR) refresh command, in which the memory itself internally maintains a refresh counter, indicating the next row address to be refreshed. Whenever the memory controller asserts RAS# while CAS# is already active, the memory will automatically refresh the row designated by its internal refresh counter, and then increment the counter. SDRAM does not have CAS# and RAS# lines, but supports other commands on its control port to perform an internal refresh cycle.

The time required to refresh a dynamic memory is an impediment to system throughput, because any time during which a refresh takes place is time during which no other device in the system can access the memory. In addition to the time occupied by the refresh operation itself, an additional penalty is incurred due to the RAS# precharge time required before the CAS#-before-RAS# command can be asserted. The RAS# precharge time, $t_{RP}$, is specified by the memory manufacturer and can typically be on the order of 40–60 nanoseconds. Typically, all banks of DRAM are refreshed in parallel, so all RAS# lines must be negated before the refresh can begin. Thus, at least a 40–60 nanosecond penalty is incurred even before the refresh begins.

Yet another penalty is incurred after the refresh completes because the memory loses the row address during a refresh. That is, a "page miss" is guaranteed after a refresh. All of the RAS# lines must therefore be negated again for the required precharge time, and then the appropriate one reasserted to clock in the desired row address for further accesses. Thus another 40–60 nanosecond delay is incurred after the refresh completes. The post-refresh RAS# precharge delay might have been incurred anyway if the next access would have required a new row address, but a refresh operation guarantees this delay.

A refresh operation also can sometimes introduce arbitration delays, if more than one master is permitted to arbitrate for control of the DRAM. For example, many systems permit a CPU, a PCI-bus controller, and a video controller to all arbitrate for control of the memory. As with the RAS# precharge penalty, the arbitration penalty can be incurred not only after a refresh, but also before a refresh operation, at which time the refresh controller is also arbitrating for control of the memory. Arbitration delays can often be hidden, that is, they can often take place in the background while some other necessary operation is taking place with respect to the memory. But in some situations, the arbitration delays cannot be completely hidden.

Some systems attempt to minimize the impact on throughput by performing "burst refreshes". A burst refresh controller in such a system accumulates a predetermined number of refresh requests from a refresh timer, and then arbitrates for control of the memory only once to perform all accumulated refreshes. If a system bursts four refreshes at a time, for example, three page-miss delays before a refresh cycle and up to three page-miss delays after a refresh cycle, and up to six arbitration delays, are avoided.

Thus, a burst refresh memory controller improves system throughput by reducing the overhead associated with the refresh activity. A new problem is introduced, however, that of memory access latency. Whereas in a non-burst refresh system another device requesting access to the memory (such as the CPU) had to wait up to the total time of a refresh cycle (plus overhead) in order to gain control of the memory, the amount of time such a device must wait in a burst refresh system can be as great as the total time of the entire burst (plus overhead).

Accordingly, there is a need for a way to increase the flexibility with which a refresh controller can perform burst refreshes. Advantageously, the refresh controller should be capable of greater flexibility in choosing when to initiate a burst refresh, as well as in choosing the length of each burst, in order to better maximize the number of refresh cycles that occur while the memory would otherwise be idle.

SUMMARY OF THE INVENTION

According to the invention, roughly described, a computer system refreshes dynamic memory in a burst, but allows other memory access requests to preempt a burst refresh before the burst completes. Not only does such a system improve throughput by reducing the overhead associated with refresh activity, but memory access latency is not significantly impacted.

In another aspect of the invention, once a burst refresh begins, it is allowed to continue for a number of refresh cycles which is greater than the number of refresh cycles then due; that is, until a time when the number of refresh cycles due is negative. This technique, referred to herein as "refresh-ahead", effectively helps to shift memory refresh activity into periods of memory bus time which would otherwise be idle. The techniques of burst refresh preemption and refresh-ahead each can be used alone in a given computer system, but the greatest throughput enhancement is achieved when both are used together.

BRIEF DESCRIPTION OF THE DRAWINGS

The invention will be described with respect to particular embodiments thereof, and reference will be made to the drawings, in which.

DETAILED DESCRIPTION

Figure 2:
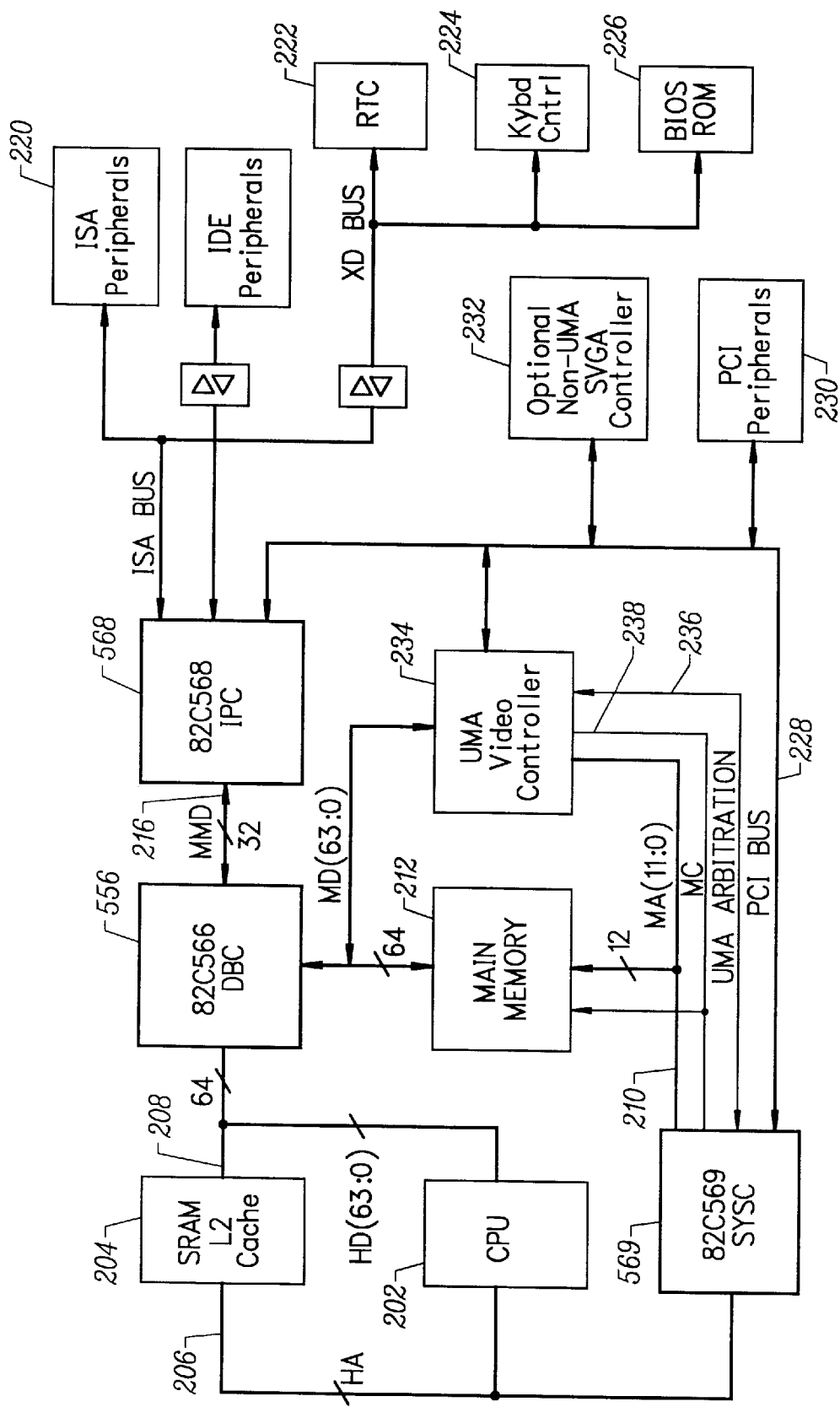
FIG. 2 is a block diagram of a computer system according to the invention.

FIG. 2 is a block diagram of a computer system according to the invention. It comprises a CPU 202, which may be, for example, an Intel Pentium-compatible microprocessor. The CPU 202 is connected to a level 2 (L2) cache memory 204 via a host address bus 206 and a host data bus, HD(63:0), 208. The host address bus 206 is also connected to a system controller (SYSC) 569 which may be, for example, an 82C569 available from OPTi Inc., Milpitas, Calif. The system controller 569 drives row and column addresses onto a memory address bus MA(11:0) 210, which is connected to an address port of main memory 212. The memory 212 may be made up of any kind of memory, and combinations of different kinds of memory, but for the purposes of the invention, memory 212 includes at least some dynamic memory such as fast-page mode, EDO, or synchronous DRAM.

The 64-bit data port of main memory 212 is connected via a memory data bus MD(63:0) 214 to the memory port of a data bus controller (DBC) 556 which may be, for example, a part number 82C566 available from OPTi Inc. The data bus controller 556 also has a host data port connected to the host data bus HD(63:0), and a 32-bit multiplexed peripheral data port connected via an MMD bus 216 to an integrated peripherals controller (IPC) 568. The integrated peripherals controller 568 can be a part number 82C568, available from OPTi Inc. The IPC 568 is connected via an ISA (industry standard architecture) bus 218 to various ISA peripherals 220, and via an 8-bit XD data bus to a realtime controller (RTC) 222, a keyboard controller 224, and to BIOS ROM 226.

The system also includes a PCI bus 228 which is connected to the system controller 569 and the integrated peripherals controller 568, as well as to optional PCI peripherals 230. A PCI video controller card 232 is also shown connected to the PCI bus 228, but this is optional because the system further includes a UMA (unified memory architecture) video controller 234 which is connected to the memory data bus MD(63:0) and can drive the memory address bus MA(11:0). The UMA video controller 234 is further connected to the PCI bus 228 for control purposes. The UMA video controller 234 arbitrates, via UMA arbitration signals 236, with PCI agents, a refresh controller and the CPU 202 for control of the main memory 212. Main memory 212 has a memory control port which can be driven via a memory control bus 238 by either the system controller 569 or the UMA video controller 234.

Figure 3:
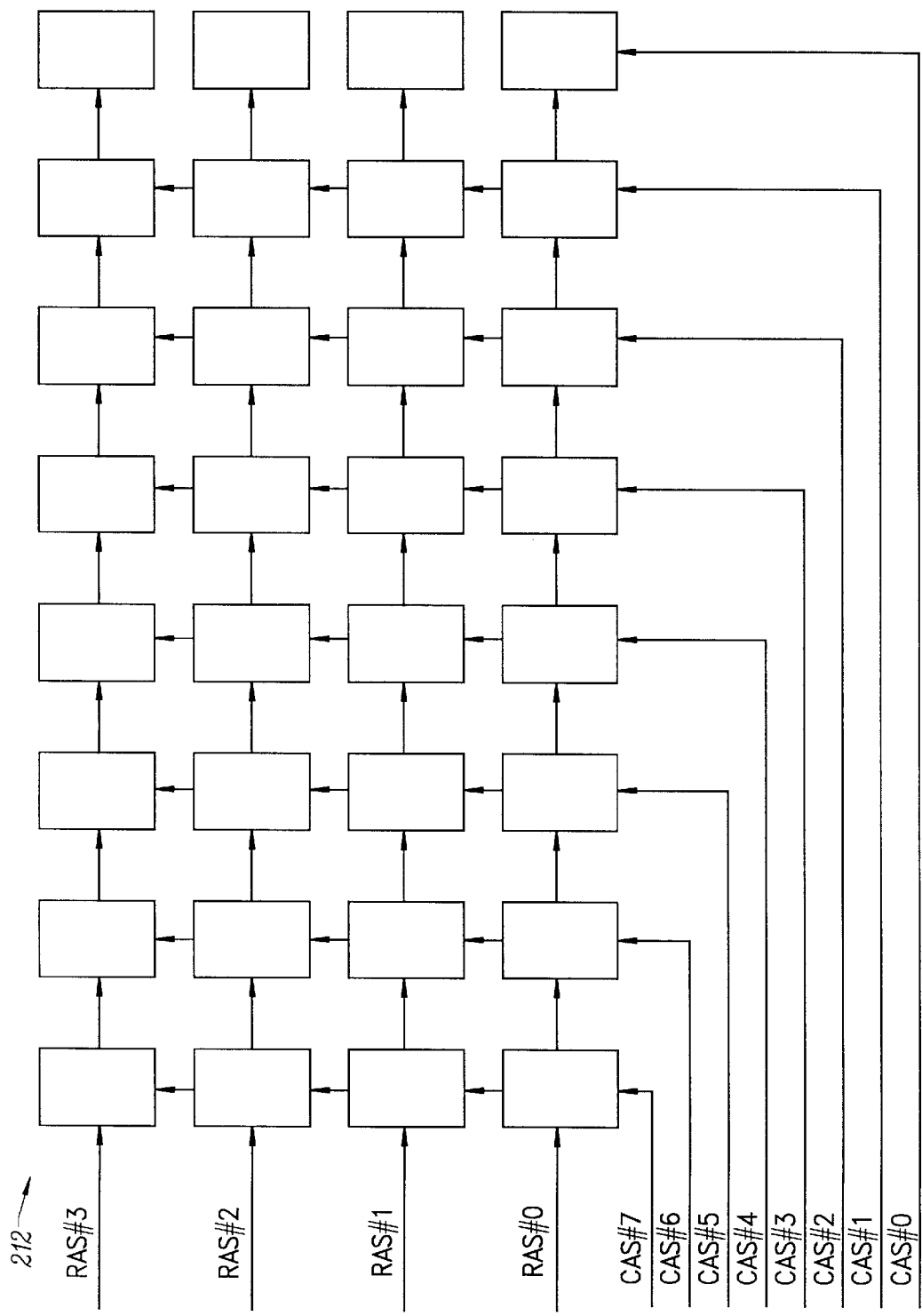
FIG. 3 is a block diagram of the main memory of the system of FIG. 2.

FIG. 3 is a block diagram of the main memory 212. In the present embodiment, the memory comprises 32 EDO DRAM chips arranged as four banks of 8 chips each. Each chip has 32 Mbit capacity organized as 8 bit-planes of 4 Mbits each. The 8 bit-planes of a chip have 8 respective data I/O pins, and these 8 leads are paralleled across the 8 chips in a bank to form the 64-bit MD(63:0) data bus (not shown in FIG. 3). The memory address leads MA(11:0) (not shown in FIG. 3) are connected to each of the chips shown in FIG. 3. In the embodiment of FIG. 3, the memory control port 238 (FIG. 2) includes RAS#(3:0), CAS#(7:0), output enable leads and read/write (R/W#) leads connected to the chips in the memory array 212. RAS#0 is connected to the RAS# input of all chips in bank 0; RAS#1 is connected to the RAS# input of all chips in bank 1; RAS#2 is connected to the RAS# input of all chips in bank 2; and RAS#3 is connected to the RAS# input of all chips in bank 3. CAS# is connected to the CAS# input of the right-hand vertical column of memory chips of FIG. 3—those chips connected to MD(7:0). CAS#1 is connected to the CAS# input of all chips that are connected to MD(15:8), and so on. CAS#7 is connected to the CAS# inputs of all chips that are connected to MD(63:56).

Figure 4:
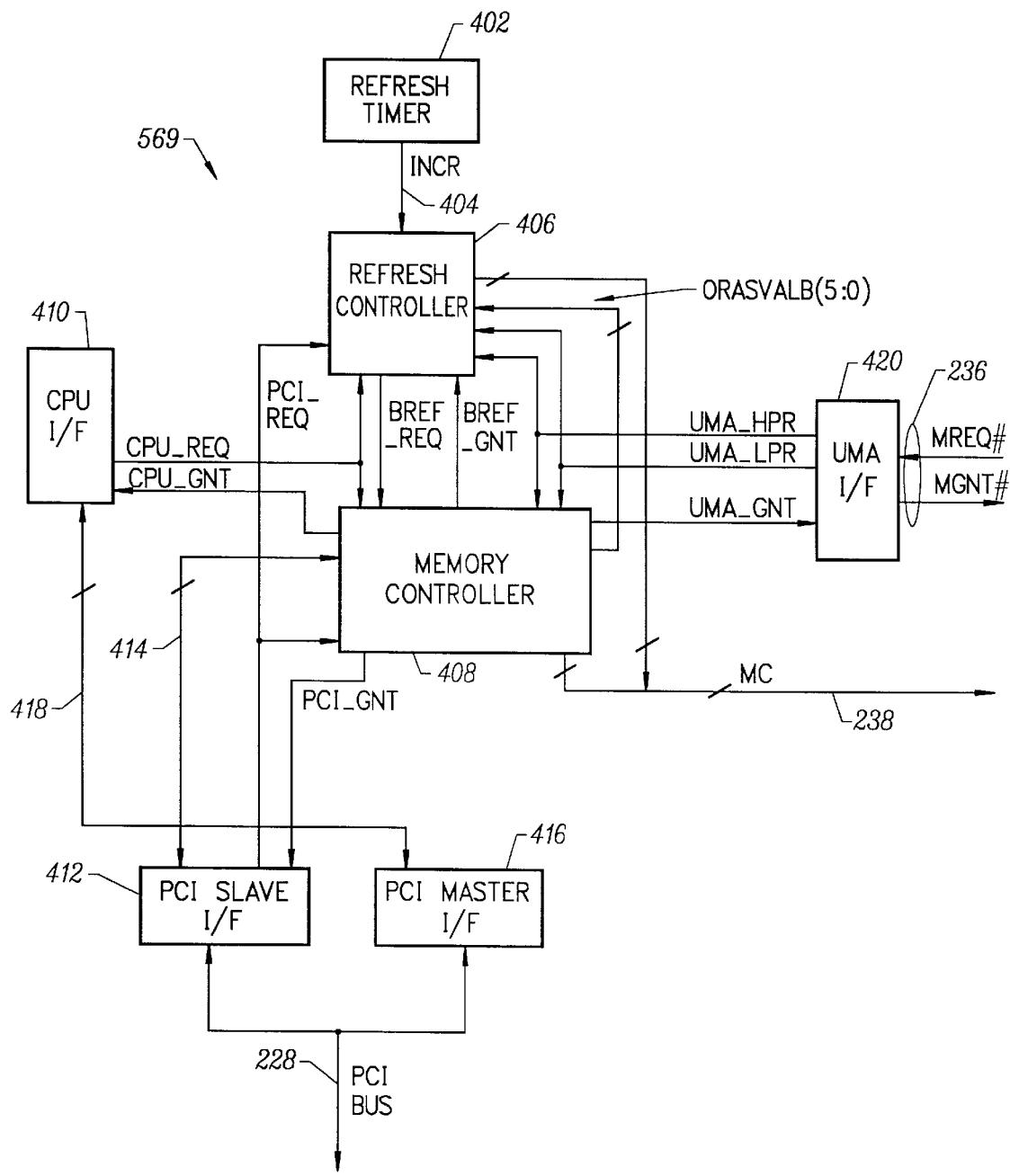
FIG. 4 is a block diagram of pertinent portions of the system controller of FIG. 2.

FIG. 4 is a block diagram of pertinent portions of the system controller 569. It includes a refresh timer 402 which asserts a pulse via an INCR signal line 404 to a refresh controller 406 at a nominal rate that is no less frequent than the per-row refresh rate required by the manufacturer of the memory 212. For example, if the memory manufacturer specifies that all 1024 rows must be refreshed each 16 milliseconds, then the nominal refresh rate of the refresh timer 402 should be set at some period no longer than 16 mS/1024= 15.625 microseconds. In the embodiment of FIG. 4, the refresh rate is set at 15 microseconds. The refresh timer 402 need not issue pulses at exactly the nominal refresh rate; the actual period can vary somewhat as long as the average pulse rate remains approximately equal to the nominal refresh rate.

The refresh controller 406 generates refresh cycles in a burst when it requests, and is granted, control of the memory. It has a BREF_REQ burst refresh request output connected to an input of a memory controller 408, and the memory controller 408 has a BREF_GNT burst refresh grant signal line connected back to an input of the refresh controller 406. The refresh controller 406 also has a memory control output port which includes RAS#(5:0), CAS#(7:0), and R/W#, and is connected to MC bus 238. The memory controller 408 similarly has a memory control output port connected to the MC bus 238 (FIG. 2). The refresh controller 406 drives the MC bus 238 when the refresh controller 406 has control of the memory 212, and the memory controller 408 drives the MC bus 238 when either the CPU or a PCI-bus agent has control of the memory 212. The UMA video controller 234 (FIG. 2) controls the MC bus 238 when it controls the memory 212. In addition, the memory controller 408 communicates the current RAS# output signals to the refresh controller 406 via signal lines ORASVALB(5:0), separately from the MC bus 238. The type of refresh cycles performed by refresh controller 406 on the DRAM of FIG. 3 is CAS#-before-RAS#. Other embodiments could use any other type of refresh, such as explicit refresh, hidden refresh, and so on.

The system controller 569 further includes a CPU interface 410 having a CPU_REQ signal output connected to an input of the memory controller 408. The memory controller 408 further has a CPU_GNT grant output connected back to the CPU interface 410. The system controller 569 further includes a slave interface 412 to the PCI bus 228, which acts as a slave responding to certain cycles issued by a PCI-bus master. The PCI-bus slave interface 412 has a PCI_REQ request signal output connected to an input of the memory controller 408, and the memory controller 408 has a PCI_GNT grant output connected back to the PCI slave interface 412. The PCI slave interface further communicates PCI cycle information with the memory controller 408 via signal lines 414. The system controller 569 further includes a PCI master interface 416 which allows the system controller 569 to master cycles on the PCI bus for the CPU 202 (FIG. 2). The CPU interface 410 communicates cycle information with the PCI master interface 416 via signal lines 418.

The system controller 569 further includes a UMA interface 420 which is connected to the UMA arbitration signal lines 236 (FIG. 2). The UMA arbitration signal lines 236 consist of two signal lines MREQ# and MGNT#, driven respectively from and to the UMA video controller 234. The UMA arbitration rules are described in detail in OPTi, "Viper-Max Scalable Multimedia PC Solution", Preliminary Data Book, Rev. 3.0 (Apr. 1, 1996) at p.128. This entire book is incorporated herein by reference. It is sufficient to note here, however, that the UMA video controller 234 can make requests to the system controller 569 for control of the memory at either a low priority or a high priority. The first assertion of MREQ# indicates a low priority request, and the UMA video controller 234 can convert this to a high priority request by negating MREQ# and reasserting it. The UMA interface 420 in FIG. 4 interprets the UMA arbitration signals 236 and outputs a low priority request signal UMA_LPR and a high priority request signal UMA_HPR, both connected to respective inputs of the memory controller 408. The memory controller 408 has a UMA_GNT grant output connected back to the UMA interface 420.

The refresh controller 406 receives not only its BREF_GNT signal from the memory controller 408, but it also receives the PCI_REQ signal, the CPU_REQ signal, the UMA_LPR signal and the UMA_HPR signal.

In operation, the refresh controller 406 maintains a count of the number of refresh cycles due. This count is incremented in response to the rising edge of each pulse from the refresh timer 402. When the refresh controller 406 determines that a programmably defined number of refresh cycles are pending, it issues a request for a burst refresh via its BREF_REQ signal line to the memory controller 408. The memory controller 408 eventually grants control of the memory to the refresh controller by asserting BREF_GNT, and the refresh controller begins issuing refresh cycles via the MC bus 238 in a burst. Unlike conventional systems, the refresh controller 406 can continue bursting beyond 0, such that the number of refresh cycles due goes negative. Furthermore, also unlike conventional systems, the refresh controller 406 allows its control of the memory 212 to be preempted part way through the burst. The refresh controller 406 asserts its own internal preemption signal when it detects assertion of PCI_REQ, CPU_REQ, UMA_LPR and/or UMA_HPR, depending on the number of refresh cycles still outstanding, and depending further on a programmable refresh preemption mode. In an embodiment, the refresh controller 406 can also assert an internal preemption signal when it detects negation of BREF_GNT from the memory controller 408.

As mentioned, after sampling BREF_REQ asserted from the refresh controller 406, the memory controller 408 asserts BREF_GNT to grant control of the memory to the refresh controller 406, The memory controller's return of BREF_GNT is considered herein to be "in response to" the assertion of BREF_REQ. As used herein, a given signal or event is "responsive" to a predecessor signal or event if the predecessor signal or event influenced the given signal or event. If there is an intervening processing element or time period, the given event or signal can still be "responsive" to the predecessor signal or event. Specifically with respect to the present embodiment, the BREF_GNT signal is considered asserted "in response to" the BREF_REQ signal even if there is a long delay between assertion of BREF_REQ and BREF_GNT, a delay long enough for one or more further refresh cycles to become due. Moreover, if a process or processing element that is present between the predecessor signal or event and the given signal or event combines more than one signal or event, the signal output of the process or processing element is considered "responsive" to each of the signal or event inputs. If the given signal or event is the same as the predecessor signal or event, this is considered herein to be merely a degenerate case in which the given signal or event is still considered to be "responsive" to the predecessor signal or event.

Figure 5:
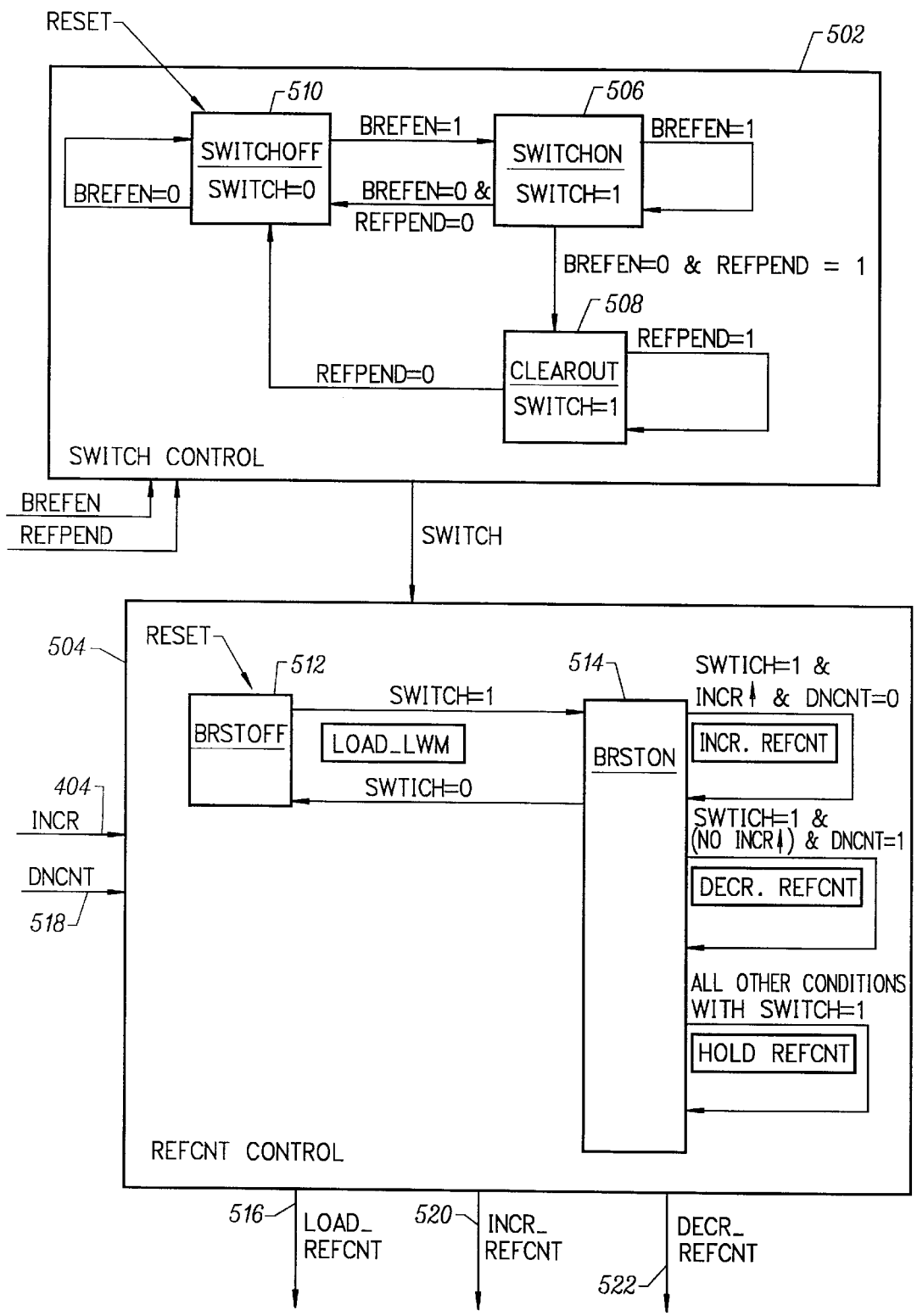
FIGS. 5–11 illustrate pertinent portions of the refresh controller of the system of FIG. 2.
Figure 6:
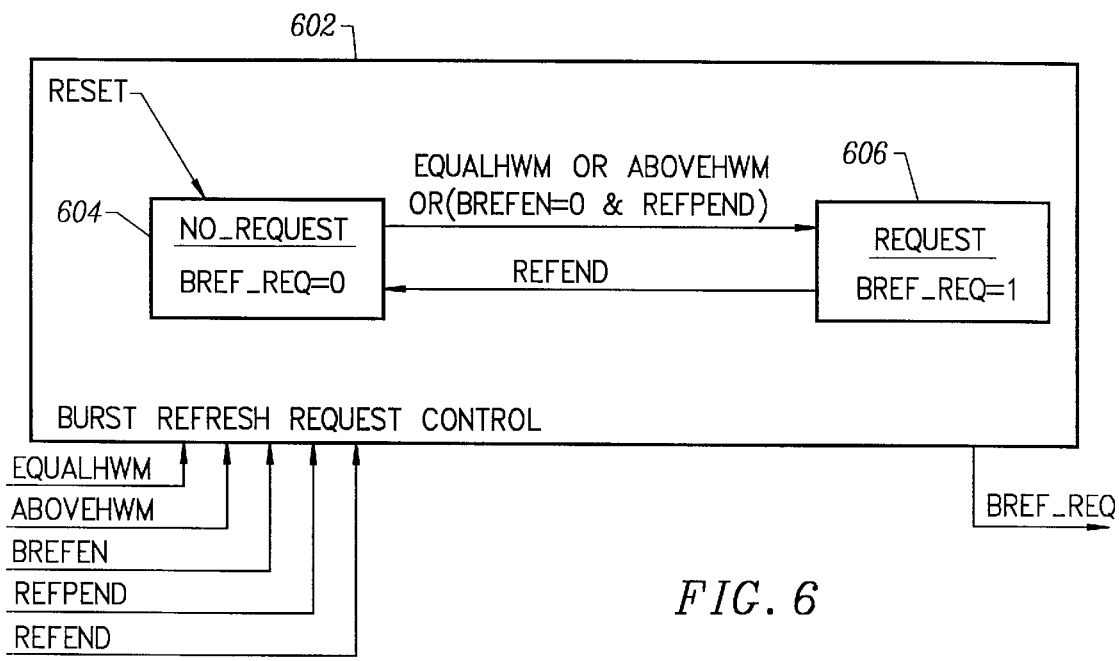
Figure 7:
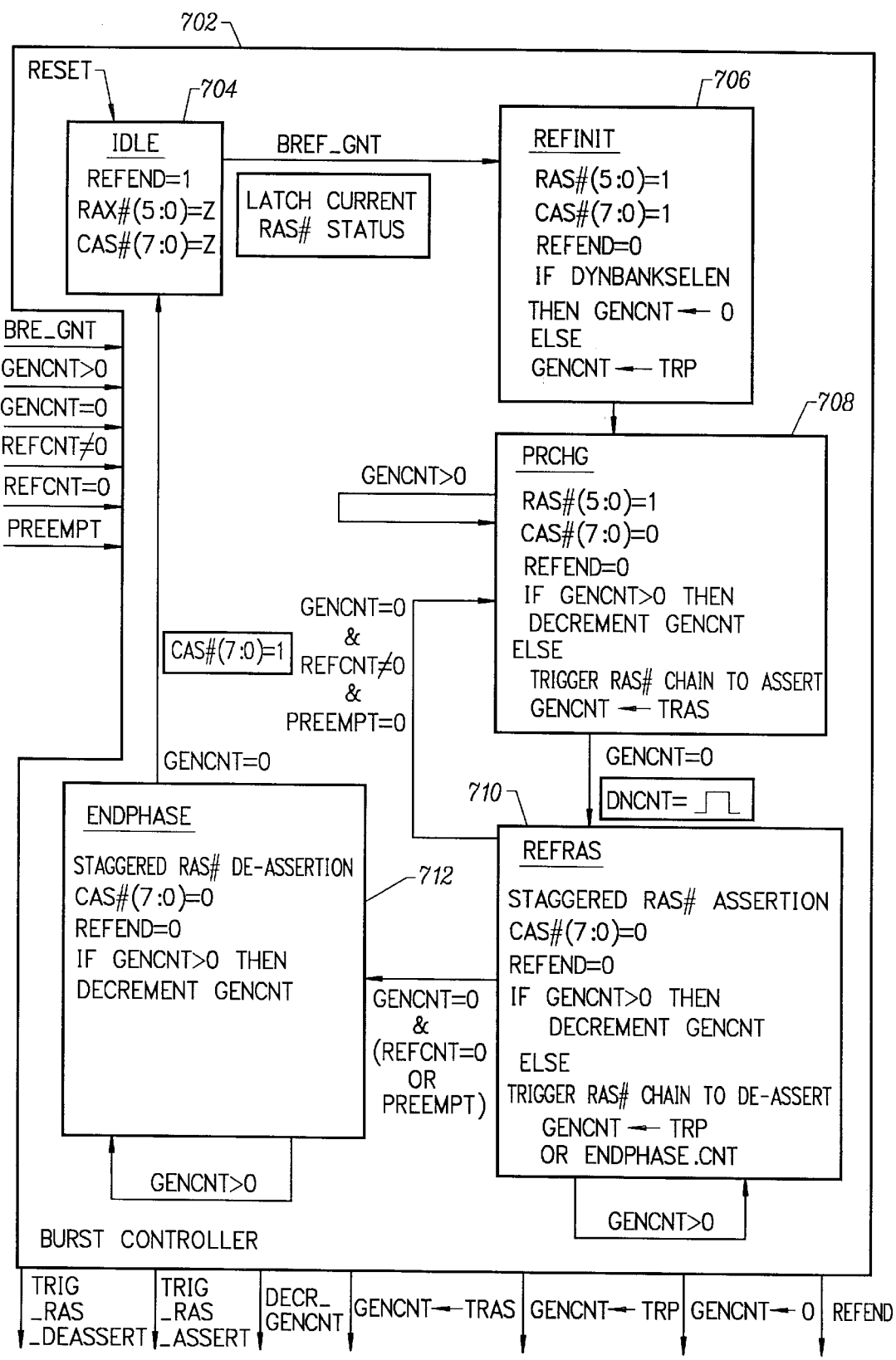

FIGS. 5–11 illustrate pertinent portions of the refresh controller 406. FIGS. 5–7 illustrate the four primary state machines in the refresh controller 406, and FIGS. 8–11 illustrate various functional units controlled by the state machines. Before entering into a discussion of these figures, it will be useful to note that some of the signals described in this specification are asserted high, whereas others are asserted low. As used herein, signals which are asserted low are given a '#' or 'B' suffix in their names, whereas those asserted high lack a '#' or 'B' suffix. Signals for which an assertion polarity has no meaning may or may not include a '#' or 'B' suffix. Also, two signal names mentioned herein that are identical except that one includes the '#' or 'B' suffix while the other omits it, are intended to represent logical compliments of the same signal. It will be understood that one can be generated by inverting the other, or both can be generated by separate logic in response to common predecessor signals. Furthermore, two signal names mentioned herein that are identical except that one includes the '#' suffix while the other includes the 'B' suffix, are intended to represent off-chip and on-chip versions of the same signal, respectively.

FIG. 5 illustrates a SWITCH CONTROL state machine 502 and a REFCNT CONTROL state machine 504. The SWITCH CONTROL state machine 502 controls the operation of the refresh controller 406 upon enablement of burst refresh and disablement of burst refresh. Upon reset, the SWITCH CONTROL state machine 502 is in a SWITCHOFF state 510, in which the state machine outputs a logic 0 on a SWITCH control lead. The CPU 202 enables burst refresh by writing a particular code into a predefined register, which is decoded to produce a signal BREFEN. As long as BREFEN=0 (inactive), the state machine 502 remains in the SWITCHOFF state. When BREFEN=1, the state machine 502 transitions to a SWITCHON state 506, where it remains as long as BREFEN=1. In state SWITCHON, the state machine 502 outputs SWITCH=1.

If the CPU 202 turns off burst refresh by writing a different code into the register, then SWITCH CONTROL state machine 502 reacts differently depending on whether any refresh cycles are then due (pending). A signal REFPEND, described below, indicates whether any refresh cycles are currently pending. If REFPEND=0, then the state machine 502 transitions directly back to SWITCHOFF state 510, where the SWITCH output is at a logic 0. If REFPEND=1 when BREFEN is brought to 0, then the state machine 502 transitions to a CLEAROUT state 508, in which SWITCH remains at a logic 1. The state machine 502 remains in the CLEAROUT state 508 until REFPEND=0, at which time the state machine 502 transitions back to SWITCHOFF state 510, returning SWITCH to a logic 0. As will be seen, the CLEAROUT state 508 allows time for all pending refresh cycles to take place.

The SWITCH signal is used in the REFCNT CONTROL state machine 504, which controls the operation of a refresh counter described below. Upon reset, the REFCNT control state machine 504 is placed in a BRSTOFF state 512. The machine 504 transitions to a BRSTON state 514 upon sampling SWITCH=1, and transitions back to the BRSTOFF state 512 if and when it samples SWITCH=0. In the transition from BRSTOFF state 512 to BRSTON state 514, the state machine 504 outputs a one clock cycle wide pulse on a LOAD_LWM signal line 516, as indicated by the rectangle around the words "LOAD_LWM" below the transition arrow.

In addition to the SWITCH signal, the state machine 504 also receives pulses at a fixed rate from refresh timer 402 (FIG. 4) via the INCR signal line 404. It also receives a DNCNT signal 518, which carries a one clock cycle-wide pulse produced by the state machine of FIG. 7, at the transition from PRCHG to REFRAS. In BRSTON state 514, if a rising edge is detected on the INCR signal line 404 while SWITCH=1 and DNCNT=0, then the state machine 504 outputs a one clock cycle wide pulse on an INCR_REFCNT signal line 520. If the state machine 504 detects DNCNT=1, while SWITCH=1, with no rising edge detected on the INCR signal line 404, then the state machine 504 outputs a one clock cycle wide pulse on a DECR_REFCNT signal line 522. As will be seen below, the signal lines LOAD_LWM, INCR_REFCNT and DECR_REFCNT control a refresh counter 802 to load, increment or decrement, respectively. Under all other conditions while SWITCH=1, no pulse is generated on these three signal lines, causing the refresh counter 802 to hold its value unchanged.

FIG. 6 illustrates a BURST REFRESH REQUEST CONTROL state machine 602, which controls the burst refresh request signal, BREF_REQ, to the memory controller 408 (FIG. 4), in response to the BREFEN signal, the REFPEND signal, and two signals from a comparator 804 (FIG. 8): ABOVEHWM and EQUALHWM. The BURST REFRESH REQUEST CONTROL state machine 602 has a NO_REQUEST state 604 and a REQUEST state 606. The state machine 602 resets into the NO_REQUEST state 604, where it outputs BREF_REQ=0. If the refresh counter 802 reaches a value which is equal to or above a predetermined high water mark value, as indicated by the signals EQUALHWM or ABOVEHWM, then the state machine transitions to the REQUEST state 606, where it outputs BREF REQ=1. The transition from NO_REQUEST state 604 to REQUEST state 606 occurs also in response to disablement of burst refresh while refresh cycles are still pending (BREFEN=0 and REFPEND). The state machine transitions back to NO_REQUEST state 604, where it again outputs BREF_REQ=0, when it receives a refresh end signal REFEND asserted from the BURST CONTROLLER state machine 702 (FIG. 7). This signal indicates that the burst refresh is over, either because the number of refresh cycles due (plus refresh ahead cycles) have been completed, or because the burst has been preempted as described in more detail below.

Figure 8:
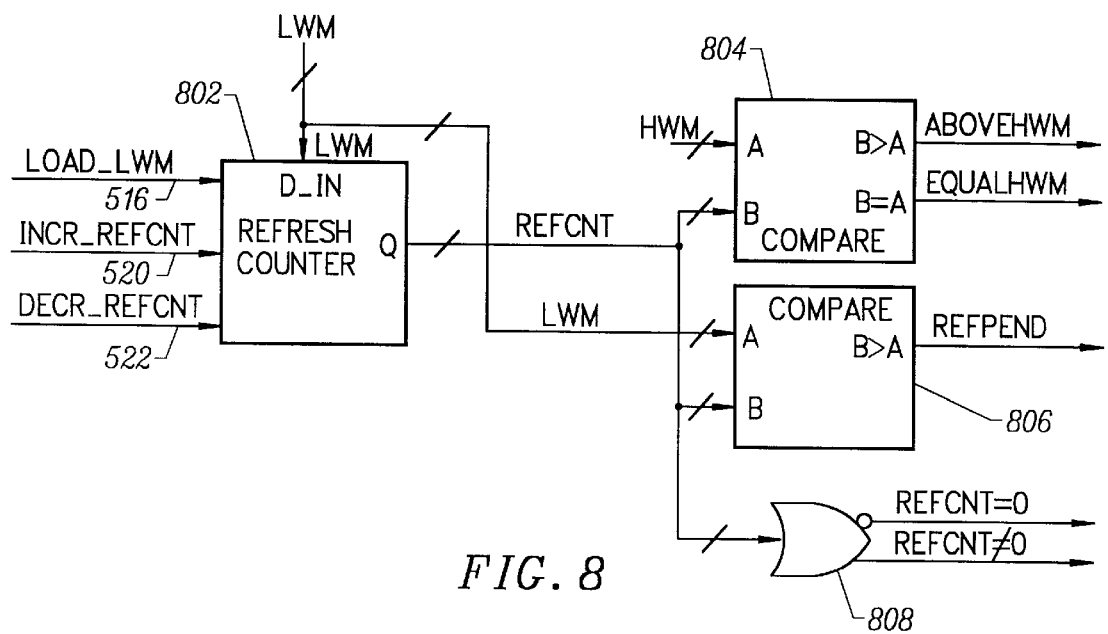

FIG. 8 illustrates the refresh counter 802 and associated logic. As mentioned, the refresh counter 802 receives the LOAD_LWM signal 516, the INCR_RECNT signal 520, and the DECR_REFCNT signal 522, from the REFCNT CONTROL state machine 504 (FIG. 5). The refresh counter 802 has a data input port connected to receive a predefined low water mark (LWM) value decoded from a register as hereinafter described. This is the value that is loaded into the refresh counter 802 in response to a pulse on the LOAD_LWM signal line 516. The refresh counter 802 also has a count output port which carries the refresh count value, REFCNT, to the B input of a comparator 804. The A input of comparator 804 receives a high water mark (HWM) value decoded from a register as hereinafter described, and the comparator 804 has a "B=A" output which carries the EQUALHWM signal, and a B>A output which carries the ABOVEHWM signal for the BURST REFRESH REQUEST CONTROL state machine 602. REFCNT is also connected to the B input of another comparator 806, the A input of which receives the low water mark value LWM. The comparator 806 has a B>A output which produces the REFPEND signal for the BURST REFRESH REQUEST CONTROL state machine 602. The several bits of REFCNT further are ORed together by an OR gate 808 which has an inverting output and a noninverting output. The inverting output carries the signal REFCNT=0, and the noninverting output carries the signal REFCNT≠0.

The operation of the circuitry of FIG. 8 is described in more detail below, but for now it will be useful to appreciate that the refresh counter 802 is initialized with a low water mark value when burst refresh is enabled. It is incremented in response to each pulse from the refresh timer 402 (FIG. 4), and is decremented in conjunction with each refresh cycle performed. The comparator 806 asserts the signal REFPEND whenever the refresh count value exceeds the low water mark (initialization) value, thereby indicating that at least one refresh cycle is pending. The comparator 804 asserts signals indicating when the refresh count equals or exceeds a predefined high water mark value (the low-water mark value plus a predefined value), and it is in response to these signals that a request is made by the burst refresh controller 406 to the memory controller 408 for control of the memory 212. The OR gate 808 indicates when the refresh count drops to 0, meaning not only that all refresh cycles that were due have now been completed, but also that the system has "refreshed ahead" by the number of refresh cycles equal to the initialization low water mark value LWM.

While in the present embodiment a single refresh counter 802 is used to keep track of the number of refresh cycles due and the number of refresh ahead cycles performed, it will be appreciated that other embodiments can use different logic to perform the same function. For example, two separate counters may be used, one to keep track of the number of refresh cycles due and one to keep track of the number of refresh ahead cycles performed. Another embodiment might use a single counter which is initialized to 0, such that positive count values indicate refresh cycles due and negative count values indicate refresh ahead cycles performed. Many alternative embodiments will be apparent to a person of ordinary skill.

FIG. 7 illustrates the BURST CONTROLLER state machine 702, which controls the burst refresh operation once the refresh controller 406 has been granted control of the memory 212. The state machine 702 resets into an IDLE state 704. In this state, the BURST CONTROLLER state machine 702 outputs a signal REFEND=1, to indicate that any prior burst refresh operation has ended. The refresh controller 406 also de-asserts the RAS#(5:0) and CAS#(7:0) signal lines, as well as the other signal lines, of the MC bus 23. Upon detection of the BREF_GNT signal asserted from the memory controller 408 (FIG. 4), the state machine 702 transitions to a REFINIT state 706. In the transition process, the state machine 702 asserts a one clock cycle wide signal to latch the current RAS# status from the ORASVALB(5:0) bus (FIG. 4), for reasons which will become apparent below. In the REFINIT state, the refresh controller 406 drives the inactive state (logic 1) onto RAS#(5:0) and CAS#(7:0). The state machine 702 also outputs REFEND=0 for the BURST REFRESH REQUEST CONTROL state machine 602 (FIG. 6).

If the memory 212 contains more than one bank of memory, then the refresh controller 406 will assert the RAS# signals to the different banks in a staggered, cyclical manner, each RAS# assertion following the previous one by one clock cycle. Staggered RAS# assertion reduces the current inrush that would otherwise occur if all RAS# signals were asserted simultaneously. In addition, the refresh controller 406 has the ability to dynamically select which RAS# signal to assert first. Usually, one RAS# signal was active at the time the refresh controller 406 was granted control of the memory 212. That RAS# signal is negated in REFINIT state 706. If dynamic starting bank selection is enabled, then the first RAS# signal to be asserted will be the RAS# signal immediately following the most recently active RAS# signal in the refresh stagger sequence. By the time the staggered refresh wraps around and is ready to assert the RAS# signal that was active when the refresh controller 406 was granted control of the memory 212, that RAS# signal has been inactive for longer than the RAS# precharge $t_{RP}$ specified by the memory manufacturer. Thus, dynamic starting bank selection permits the RAS# precharge to take place in the background without delaying the refresh cycle.

Returning to FIG. 7, dynamic starting bank selection is enabled by a code written into a register, described below, which is decoded by the refresh controller 406 to produce a signal DYNBANKSELEN. In the REFINIT state 706, if DYNBANKSELEN is active, then the state machine 702 asserts a signal GENCNT←0. Otherwise, it asserts an output signal GENCNT←TRP. As will be seen, the state machine 702 utilizes a generator counter 902 for a number of purposes, and in the REFINIT state 706, the state machine 702 is initializing the generator counter with 0 if dynamic starting bank selection is enabled, or TRP if dynamic starting bank selection is not enabled. TRP is the number of clock cycles required to meet the memory manufacturer's RAS# precharge time $t_{RP}$, and is programmed by the CPU 202 into a register upon system initialization.

After REFINIT state 706, the BURST CONTROLLER state machine 702 transitions to a PRCHG state 708, which awaits any RAS# precharge time required before assertion of the first RAS# signal for refresh. CAS#(7:0) are all asserted during PRCHG state 708, to begin the CAS#-before-RAS# refresh commands, but RAS#(5:0) remain inactive. The state machine 702 also maintains REFEND inactive in PRCHG state 708. The state machine 702 remains in PRCHG state 708 while GENCNT>0, decrementing GENCNT once each clock cycle.

When GENCNT=0, the state machine 702 triggers a RAS# chain to assert the RAS# signals (as described hereinafter), loads the generator counter with a value TRAS, and transitions to a REFRAS state 710. TRAS is the number of clock cycles required to satisfy the time period $t_{RAS}$ specified by the memory manufacturer for maintaining RAS# in an active state, and is programmed into a register by the CPU 202 upon system initialization. It can be seen that if dynamic starting bank selection was enabled, then the state machine 702 would remain in the PRCHG state 708 for only the one clock cycle required for CAS# assertion to precede the first RAS# assertion. Otherwise, it remains in state 708 for the required RAS# precharge time.

Upon transition from the PRCHG state 708 to the REFRAS state 710, burst controller state machine 702 also issues a one clock cylce-wide pulse on DNCNT as previously mentioned.

In REFRAS state 710, both CAS#(7:0) and REFEND are held low while the RAS# chain asserts RAS# to all banks in its predefined cyclical sequence. The state machine 702 decrements GENCNT once each clock cycle, and remains in REFRAS state 710 while GENCNT>0. When GENCNT=0, this indicates that the first RAS# has been active for the required RAS# pulse width time $t_{RAS}$. The BURST CONTROLLER state machine 702 triggers the RAS# chain to de-assert at this time, and reloads the generator counter 902 with either TRP or with an ENDPHASE_CNT value described below. It can be seen that the state machine 702 waits only until the end of the RAS# pulse width for the first RAS# signal in the stagger sequence before triggering the RAS# negation sequence. Depending on the number of banks in main memory 212, the RAS# chain could still be in the process of asserting other RAS# signals at this time.

As mentioned, the value loaded into the generator counter 902 when the RAS# chain is triggered to de-assert, is either TRP or a value ENDPHASE_CNT. ENDPHASE_CNT is used only when the burst refresh is about to be terminated, either because memory has been refreshed ahead as far as permitted, or because further refresh cycles in the burst have been preempted. The ENDPHASE_CNT value is the number of clock cycles required for the staggered RAS# chain de-assertion to complete, and depends upon the number of banks present in main memory 212. In one embodiment, it is assumed here that all banks are always present.

The state machine 702 transitions out of REFRAS state 710 when GENCNT=0. If the refresh count is still greater than 0 (as indicated by the REFCNT≠0 signal in FIG. 8), and the burst refresh has not been preempted (which would be indicated by an active value on a PREEMPT signal described below), then the state machine 702 transitions back to the PRCHG state 708 to await the RAS# precharge time and trigger the RAS# chain to assert for the next refresh cycle. Note that state machine 702 does not wait until the last RAS# signal in the stagger sequence is asserted before beginning the precharge delay for the next refresh cycle in the burst; it begins the precharge delay count immediately after triggering the first RAS# assertion in the sequence. The present embodiment makes this possible because other than the assertion and de-assertion triggers, the RAS# chain operates independently of the burst controller 702.

If either the refresh count REFCNT=0 or the burst refresh has been preempted when GENCNT=0, then the transition is to an ENDPHASE state 712. Here the staggered RAS# de-assertion initiated in REFRAS state 710 is allowed to complete while GENCNT remains>0. GENCNT is decremented once each clock cycle while the state machine 702 is in the ENDPHASE state 712, until it reaches 0. CAS#(7:0) and the REFEND signal all remain low while in ENDPHASE state 712.

When GENCNT reaches 0, the state machine 702 transitions from ENDPHASE state 712 back to the IDLE state 704, negating CAS#(7:0) for one clock cycle. In transitioning to IDLE state 704, REFEND is asserted and the RAS# (5:0) and CAS#(7:0) outputs of the refresh controller 406 are de-asserted to allow other masters to access the memory 212.

Figure 9:
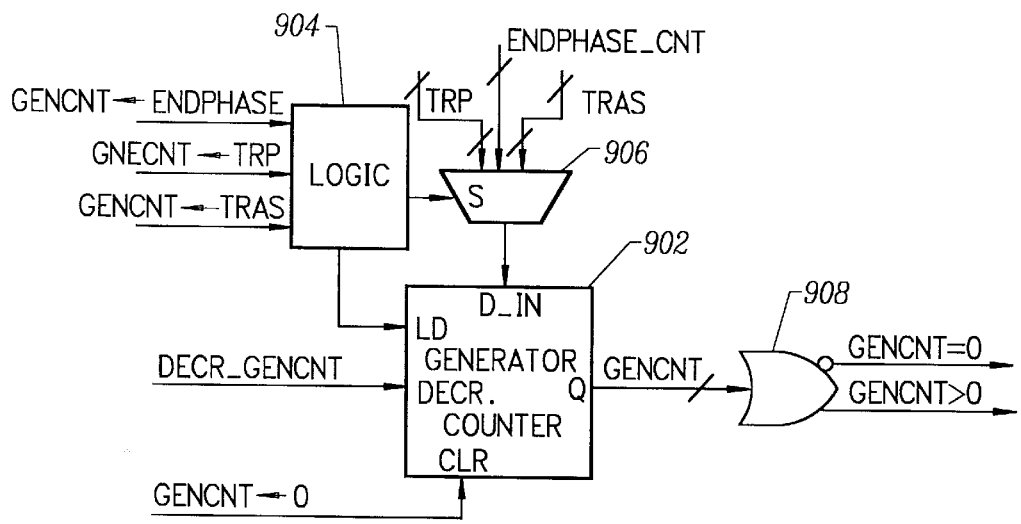

FIG. 9 is a block diagram illustrating the generator counter 902 and associated circuitry. The generator counter 902 has a clear input which receives the GENCNT←0 signal and a decrement input which receives a DECR_GENCNT signal from the BURST CONTROLLER state machine 702. The signals GENCNT←ENDPHASE, GENCNT←TRP and GENCNT←TRAS are provided to a logic circuit 904 which provides a selection input to a multiplexer 906 and also provides a pulse to a load input of the generator counter 902. The logic circuit 904 causes the multiplexer 906 to select among three values (ENDPHASE_CNT, TRP and TRAS) for providing to a data input of the generator counter 902, for loading in response to a pulse on the load input. The count output of the generator counter 902 carries the GENCNT value, the several bits of which are ORed together in an OR gate 908. An inverting output of the OR gate 908 carries the GENCNT=0 signal, and a noninverting output of the OR gate 908 carries a GENCNT>0 signal. It can be seen that the circuitry of FIG. 9 assists the BURST CONTROLLER state machine 702 by loading in one of the three values TRP, ENDPHASE_CNT or TRAS, or clearing to 0, as called for by the state machine 702. It then decrements in response to each decrement pulse issued by the state machine 702 and indicates to the state machine 702 when its count value has reached 0.

Figure 10:
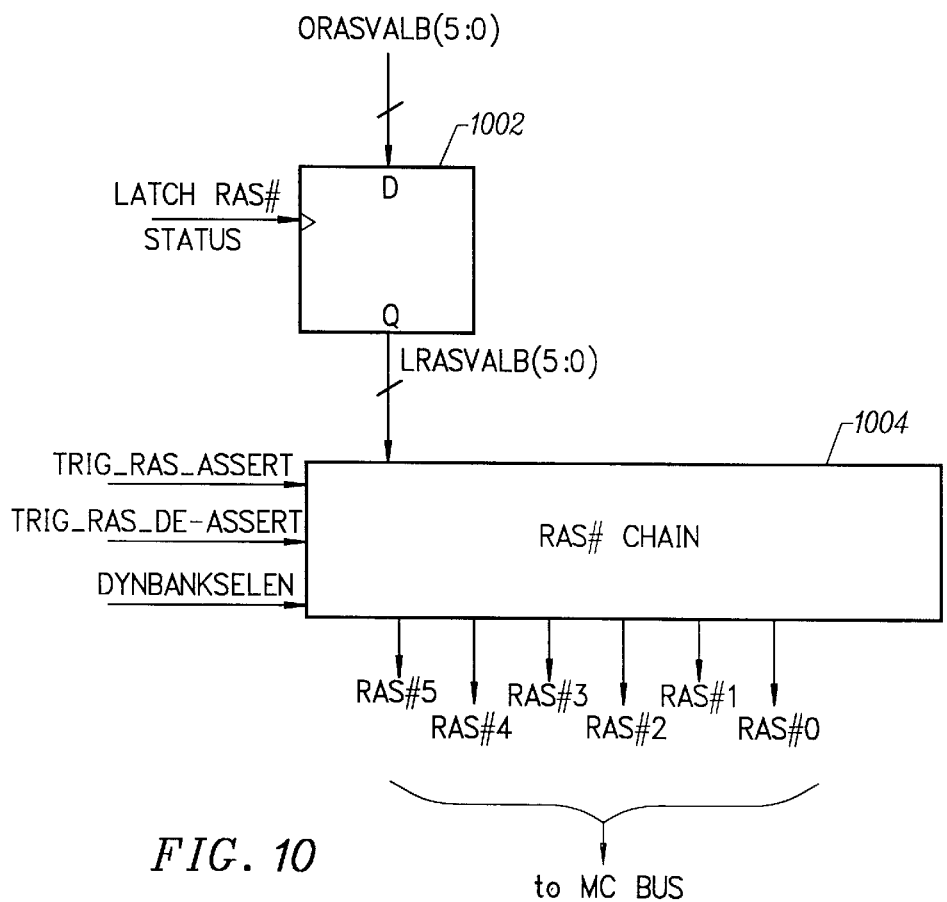

FIG. 10 is a block diagram of the circuitry controlled by the BURST CONTROLLER state machine 702. It comprises a register 1002, the data input of which is connected to receive the value on the ORASVALB(5:0) bus from the memory controller 408 (FIG. 4). It has a clock input connected to receive the LATCH RAS# STATUS signal from the BURST CONTROLLER state machine 702, and has a Q output connected to an input port of a RAS# chain 1004. The RAS# chain 1004 also receives the trigger signals from the BURST CONTROLLER state machine 702 for asserting and de-asserting the RAS# signals, and also receives the DYNBANKSELEN signal.

In operation, when the refresh controller 406 is granted control of the memory 212, the BURST CONTROLLER 702 causes the register 1002 to latch the current RAS# status from the memory controller 408. This status is used by the RAS# chain 1004 to keep track of which RAS# signal was active most recently prior to the burst refresh. When the RAS# chain 1004 samples TRIG_RAS_ASSERT active, it begins asserting the RAS# signals for all banks in main memory 212 which contain memory, in a staggered manner. That is, it asserts each RAS# signal one clock cycle after it asserted the previous RAS# signal until all RAS# signals are active. If dynamic starting bank selection is enabled (DYNBANKSELEN=1), then the RAS# chain 1004 begins with the RAS# signal immediately following, in its predefined stagger sequence, the RAS# signal that was active most recently before the refresh controller was granted control of the memory 212. If dynamic starting bank selection is disabled, then the RAS# chain 1004 begins at a fixed RAS# in the sequence. In either case, the sequence is considered cyclical. Similarly, when the RAS# chain 1004 samples TRIG_RAS_DEASSERT active, it begins negating the RAS# signals in the same stagger sequence used for assertion, and beginning with the same RAS# output.

Figure 11:
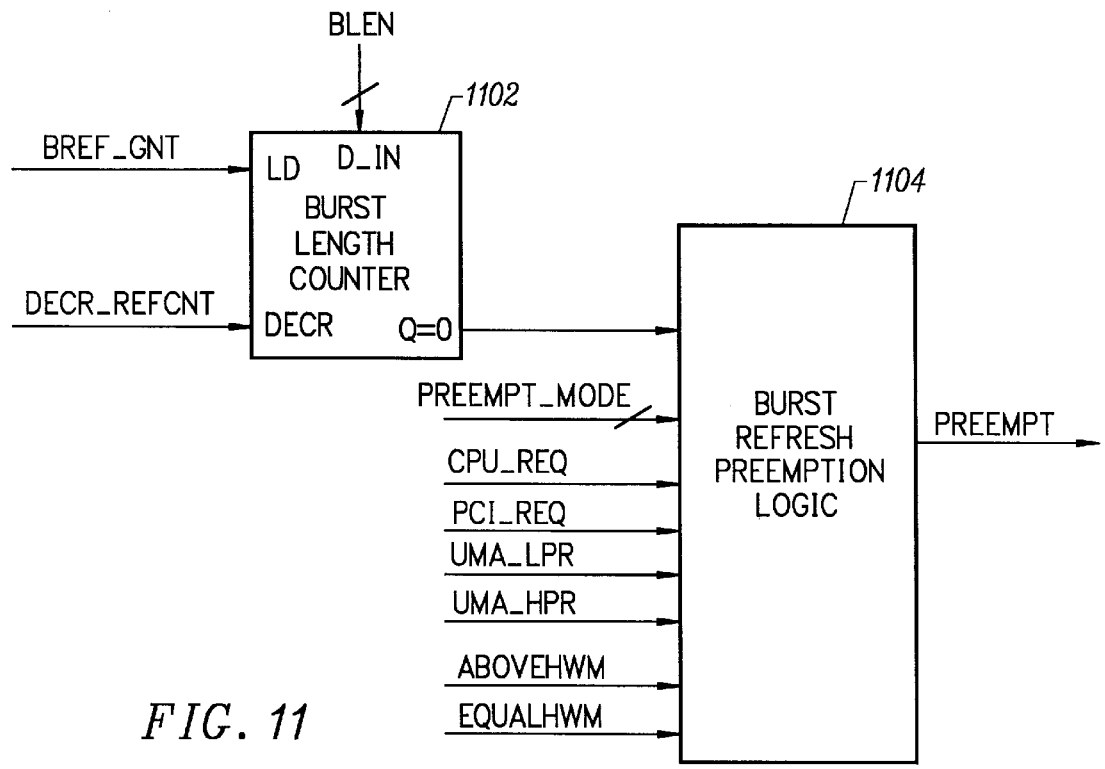

FIG. 11 is a block diagram of circuitry used to generate the PREEMPT signal for the BURST CONTROLLER state machine 702 (FIG. 7). It comprises a burst length counter 1102, which has a data input port coupled to receive a minimum burst length value BLEN. BLEN is decoded from a configuration option written by the CPU 202 into a register. The burst length counter 1102 loads BLEN when the burst controller state machine 702 transitions from REFINIT state 706 to PRCHG state 708, and decrements in response to each assertion of DECR_REFCNT from the REFCNT CONTROL state machine 504 until its count reaches 0. Thus the burst length counter is loaded with the minimum burst length BLEN at the beginning of each burst refresh, and is decremented each time a refresh cycle takes place within the burst, until it reaches 0, where it remains. The burst length counter 1102 has a Q=0 output which indicates when the burst length has reached or exceeded BLEN, and this signal is provided to a burst refresh preemption logic circuit 1104. Burst refresh preemption logic 1104 also receives a PREEMPT_MODE value decoded from a configuration register, and also the following arbitration request signals for control of the memory 212: CPU_REQ, PCI_REQ, UMA_LPR and UMA_HPR. Burst refresh preemption logic 1104 also receives ABOVE-HWM and EQUALHWM from the comparator 804 (FIG. 8). The burst refresh preemption logic 1104 produces the PREEMPT signal for the BURST CONTROLLER state machine 702.

The burst refresh preemption logic 1104 determines when to assert PREEMPT in response to one of the arbitration requests, in dependence upon the PREEMPT_MODE configuration. Different embodiments can define different criteria for preempting the burst, but the burst refresh preemption logic 1104 implements three sets of criteria depending on whether the PREEMPT_MODE is 0, 1 or 2. In preemption mode 0, the refresh burst is preempted at the end of the current refresh cycle if UMA_HPR has become active. The refresh burst is preempted when the refresh count drops below the high water mark if any other memory arbitration request is pending. Any memory arbitration request that is asserted after the refresh count drops below the high water mark will preempt the burst. Otherwise, the burst refresh is allowed to continue until the refresh counter reaches 0.

In preemption mode 1, the refresh burst is preempted at the end of the current refresh cycle if a high priority UMA request is pending (UMA_HPR active). If any other memory arbitration request is pending, then the burst is preempted once the refresh count falls below the high water mark and the number of refresh cycles performed reaches BLEN (as indicated by the Q≦0 output of the burst length counter 1102). Any memory arbitration request asserted thereafter will preempt the burst. Otherwise, the burst continues until the refresh count reaches 0.

In preemption mode 2, the refresh burst is preempted at the end of the current refresh cycle if UMA_HPR has become active. If CPU_REQ has become active, then the refresh burst is preempted once the number of refresh cycles performed has reached BLEN. If any other memory arbitration request is pending, then refresh burst is preempted once the refresh count drops below the high water mark and the number of refresh cycles performed has reached BLEN. Any memory arbitration request asserted thereafter will preempt the burst. Otherwise, the burst refresh continues until REFCNT=0.

As mentioned, a number of the configuration options for the refresh controller 406 are decoded from values programmed into configuration registers of the system controller 569 (FIG. 2) by the CPU 202. To be specific, three bits of a configuration register decode to control the burst refresh enable, the refresh-ahead amount (LWM), and whether to enable dynamic starting bank selection. This configuration value decodes as set forth in Table I.

TABLE I

| 210 | BREFEN | LWM | DYNBANKSELEN |
|---|---|---|---|
| 111 | 0 | N/A | N/A |
| 110 | 1 | 0 | 0 |
| 101 | 1 | 3 | 0 |
| 100 | 1 | 7 | 0 |
| 011 | 0 | N/A | N/A |
| 010 | 1 | 0 | 1 |
| 001 | 1 | 3 | 1 |
| 000 | 1 | 7 | 1 |

Three other configuration bits decode to control the preemption mode, the high water mark value (HWM) and the minimum refresh burst length (BLEN). This value decodes as set forth in Table II.

TABLE II

| 210 | Preemption Mode | HWM | BLEN |
|---|---|---|---|
| 111 | 0 | 5 | N/A |
| 110 | 1 | 5 | 2 |
| 101 | 1 | 5 | 3 |
| 100 | 1 | 5 | 4 |
| 011 | 0 | 4 | N/A |
| 010 | 2 | 4 | 1 |
| 001 | 2 | 4 | 2 |
| 000 | 2 | 4 | 3 |

Figure 1:
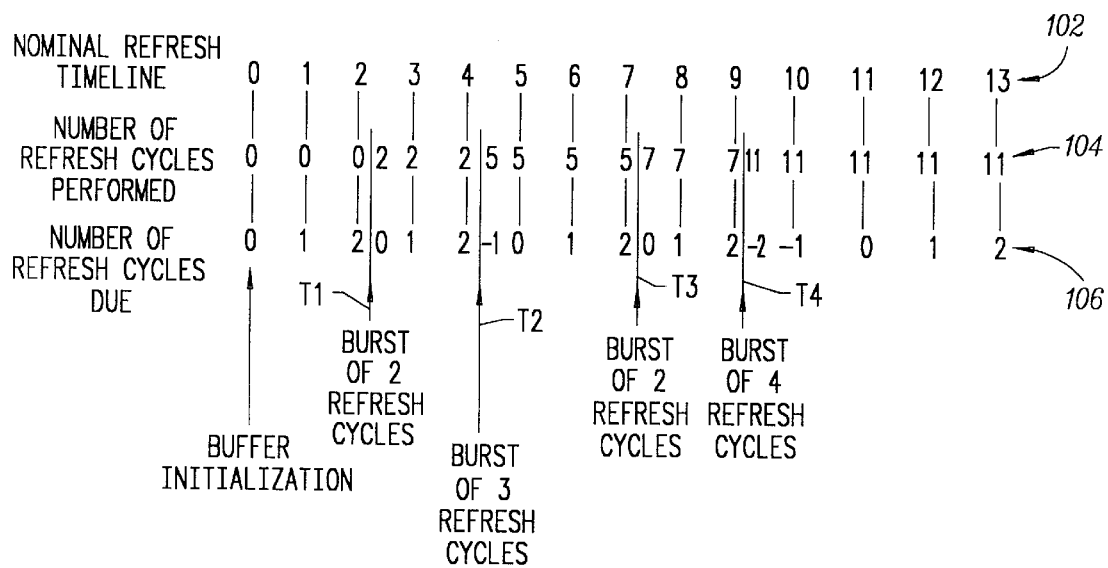
FIG. 1 illustrates three refresh timelines.
Figure 12:
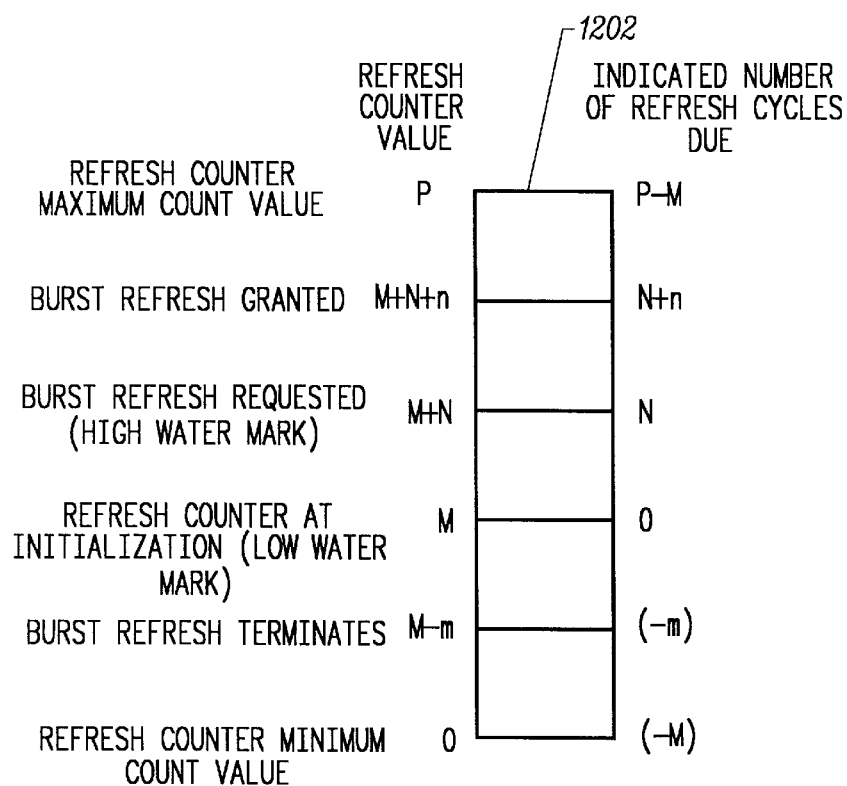
FIG. 12 is a diagram conceptually illustrating a refresh buffer implemented in the system of FIG. 2.

The overall operation of the refresh controller 406 will be best understood by referring to FIGS. 12 and 1. Referring to FIG. 12, at 1202 is illustrated a refresh buffer whose current level indicates the number of refresh cycles pending (due) at any given time. Whenever a new refresh cycle is due, as indicated by a rising edge on the refresh timer 402 output, the refresh buffer 1202 fills up incrementally higher. Whenever a refresh cycle is performed, the refresh buffer empties incrementally. The refresh buffer 1202 is only a logical construct, since nothing is actually contained therein; a pointer to the current level is the only value of significance. The refresh buffer 1202, therefore, is implemented in the present embodiment by the refresh counter 802 (FIG. 8).

Referring to FIG. 1, three timelines 102, 104 and 106 are shown. The timeline 102 represents a "nominal" refresh timeline and indicates the number of refresh cycles that would have been performed since a predefined starting time assuming each tick of the refresh timer resulted in an immediate refresh cycle. In the present embodiment, the predefined starting time is designated by the time at which the buffer 1202 (refresh counter 802) is initialized. Timeline 104 indicates the number of refresh cycles that have actually been performed since the predefined start time. Bursts of two, three, two and four refresh cycles are indicated at times T1, T2, T3 and T4 of the timeline, respectively. Timeline 106 indicates the number of refresh cycles currently due at any given time, and is equal to the nominal number of refresh cycles at that time according to the nominal refresh timeline 102, less the number of refresh cycles actually performed by that time according to the timeline 104.

In a conventional system, the number of refreshes due is always positive or 0. The present invention, on the other hand, allows a negative number of refresh cycles due, meaning that it allows the refresh controller to "refresh-ahead" by some number of refresh cycles. In FIG. 12, if the current level of the refresh buffer 1202 is (–m), then the system has performed m refresh cycles ahead of the number that it should have performed since buffer initialization as given by the number of rising edges on the output of the refresh timer 402. As shown in FIG. 1, a refresh-ahead of m refresh cycles means that the number of refresh cycles actually performed is ahead of the nominal refresh timeline 102 by m refresh cycles. By allowing refresh-ahead, the refresh controller 406 is able to move more refresh cycles into periods of idle time of the memory 212.

In one implementation of the refresh buffer 1202, the refresh counter is initialized to 0, with positive count values indicating a number of refresh cycles due, and negative count values indicating the number of refresh cycles by which the refresh controller is ahead of the nominal refresh timeline. In the refresh controller 406, the refresh counter 802 is implemented somewhat differently. Specifically, it is implemented such that all count output values are positive. The counter 802 is initialized with a "low water mark" value (LWM, also herein called M), thereby allowing the refresh controller 406 to be up to M refresh cycles ahead of the nominal rate. M is programmable, as previously described. In addition, the refresh counter 802 has a maximum count value of P, thereby allowing the refresh controller 406 to be up to P–M refresh cycles behind the nominal refresh timeline.

Referring to FIG. 12, the left side of the buffer 1202 specifies values in the refresh counter 802, whereas the right side of the buffer 1202 specifies the number of refresh cycles due, as indicated by the refresh counter value on the left side of the buffer 1202. Thus, when the counter 802 output is at M, as specified on the left side of buffer 1202, the number of refresh cycles that are due is 0, as specified on the right side of buffer 1202.

In operation, after initialization to M, each rising edge of the refresh timer 402 output signal causes the refresh counter to increment its output value. When the count reaches a value M+N indicating that N refresh cycles are due, then the refresh controller 406 asserts BREF_REQ to the memory controller 408. This level of the refresh buffer 1202 is sometimes referred to herein as the "high water mark". Sometime later, the memory controller 408 grants control of the memory 212 to the refresh controller 406. One or more additional refresh cycles could have become due during the wait, so FIG. 12 shows burst refresh granted when the refresh buffer 1202 indicates that the number of refresh cycles due is N+n (refresh counter value M+N+n). The value of n is $\geq 0$. The memory controller 408 must grant the memory 212 to the refresh controller 406 no later than when the number of refresh cycles due reaches the value P–M (refresh counter value P), because P is the maximum count value that can be represented in the refresh counter 802. (P is made large enough, and BREF_REQ is given a sufficiently high arbitration priority, to guarantee this.) Therefore, it can be said that $0 \leq n \leq P-M-N$.

Once burst refresh is granted, the refresh controller 406 issues refresh cycles in a burst. The refresh counter 802 is decremented in conjunction with each refresh cycle in the burst. The burst can be preempted at any time in accordance with the preemption criteria specified on configuration, and such preemption can occur when the number of refresh cycles still due is positive, 0 or negative (refresh counter value above, equal to, or below, the counter initialization value M. FIG. 12 shows the burst refresh terminated while the number of refresh cycles due is at a value (–m) (refresh counter value M–m), but the value (–m) can be positive, 0 or negative at the termination point of any given burst. If the burst is not preempted, then it continues until the number of refresh cycles due is at (–M) (refresh counter value 0). It will be appreciated that if the number of refresh cycles due upon termination of a burst is negative (i.e., a refresh-ahead situation), then the burst will have included more refresh cycles than the number that were pending when the burst began.

Once a burst refresh terminates, either by preemption or by reaching the refresh counter minimum count value, the refresh controller 406 does not make another burst refresh request until the count once again indicates that N refresh cycles are due (refresh counter value M+N). If the immediately preceding burst resulted in a refresh-ahead, then the number of rising edges generated by the refresh timer 402 before the refresh controller 406 again asserts BREF_REQ will exceed N. Note, however, that other embodiments could assert BREF_REQ earlier, if desired. For example, an embodiment could assert another burst refresh request after every burst refresh preemption, until the number of refresh cycles due reaches (–M).

Figure 13:
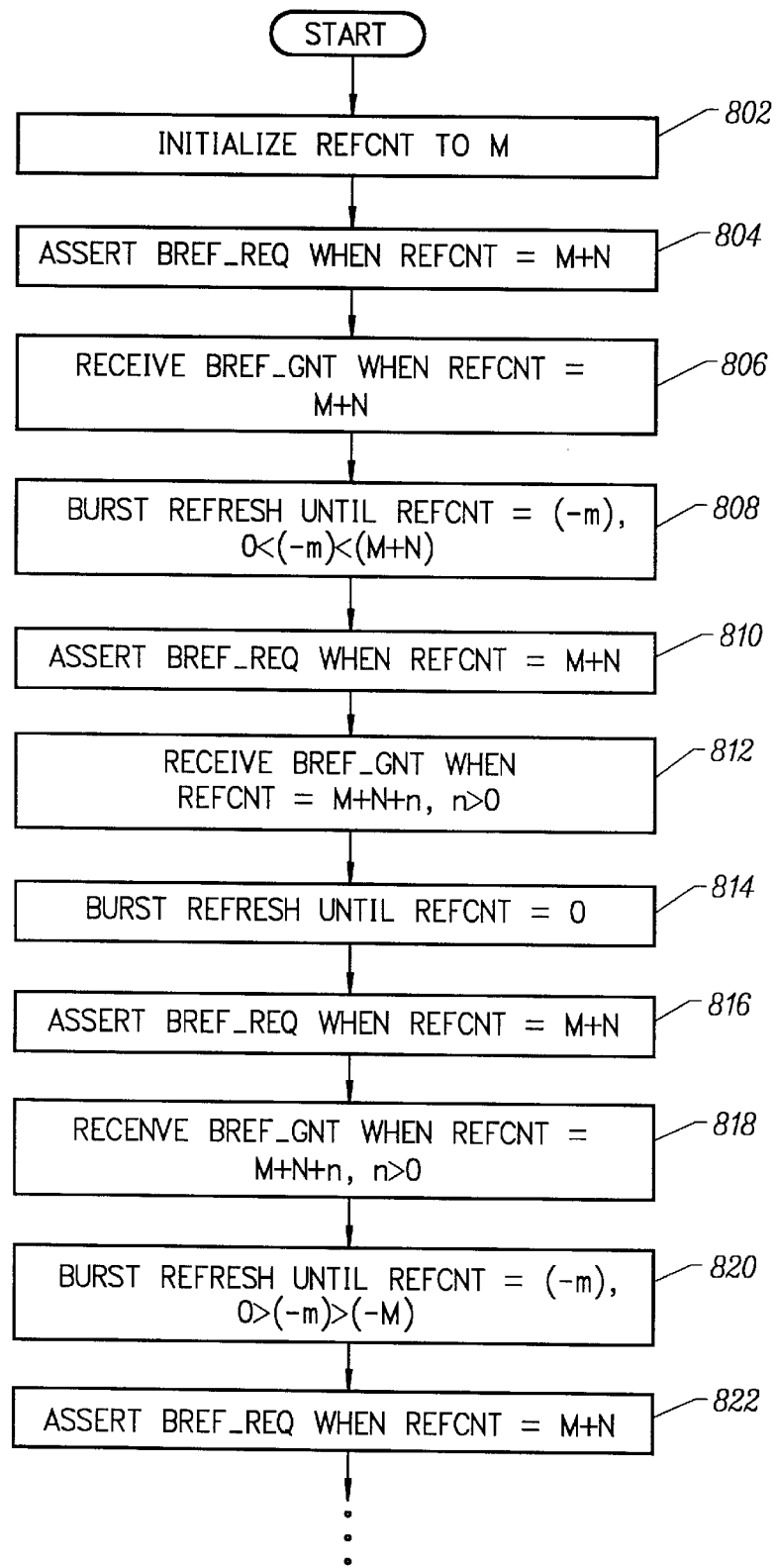
FIG. 13 is a flow chart illustrating a sample sequence of events taking place in the system of FIG. 2.

Given the above, FIG. 13 is a flow chart illustrating a sample sequence of events taking place in the system of FIG. 2. In a step 1302, the refresh counter 802 is initialized to the value M. In step 804, when the refresh count reaches the high water mark value M+N, the refresh controller 406 asserts BREF_REQ. In step 806, the memory controller 408 returns BREF_GNT while the refresh counter is still at M+N. In step 808, the refresh controller 406 issues refresh cycles in a burst, until the refresh count value reaches a value (–m), which is positive but less than M+N. Soon the refresh count again reaches M+N, and the refresh controller 406 again asserts BREF_REQ at that time (step 810). In step 812, the memory controller 408 returns BREF_GNT, but only after one or more additional refresh cycles have become due. Thus, at the time of step 812, the refresh count is at M+N+n, where n>0. In step 814, the refresh controller 406 issues refresh cycles in a burst until it is preempted. In step 814, preemption happens to occur when the refresh counter is at 0. The refresh controller 406 then again waits until the refresh count reaches M+N, and in step 816, again asserts BREF_REQ. In step 818, the memory controller 408 returns BREF_GNT. As in step 812, the refresh count at the time of BREF_GNT is M+N+n, where n>0. In step 820, the memory controller 408 issues refresh cycles in a burst until it is preempted which, in the case of step 820, occurs when the refresh count is at (–m), 0>(–m)>(–M). The refresh controller 406 thereafter again waits until the refresh counter reaches M+N, at which time it asserts BREF_REQ again (step 822). The process continues, perhaps with the next burst continuing all the way until the refresh count reaches 0. The process continues in this manner, with the overall number of refresh cycles performed since buffer initialization getting a little behind or a little ahead of the nominal refresh timeline, and thereby providing the increased flexibility desirable to perform a greater proportion of refresh cycles during periods when the memory would otherwise be idle.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

I claim:

1. A method for managing refreshes of a dynamic memory, comprising the steps of:

maintaining an indication of a number of refresh cycles due;

increasing said number at a predetermined average rate; and at a first time when said number of refresh cycles due is positive, burst refreshing said memory with a number of refresh cycles which exceeds said number of refresh cycles due at said first time.

2. A method according to claim 1, wherein said step of maintaining an indication comprises a step of maintaining a count which indicates said number of refresh cycles due by outputting a value M plus said number of refresh cycles due, M being a predetermined fixed positive integer.

3. A method according to claim 1, further comprising the step of requesting access to said memory in response to said number of refresh cycles due reaching a predetermined high water mark value N, N>1, and wherein said step of burst refreshing occurs in response to said access request.

4. A method according to claim 3, wherein said step of increasing increases said number at least once after said step of requesting access to said memory and before said first time.

5. A method according to claim 1, wherein said step of burst refreshing comprises the steps of:

decrementing said number of refresh cycles due in conjunction with each refresh cycle performed in said burst refresh; and terminating said burst refresh before any further refresh cycles occur after a refresh cycle in conjunction with which said step of decrementing decrements said number of refresh cycles due to a particular value less than 0.

6. A method according to claim 5, wherein said step of terminating terminates said burst refresh in response to said number of refresh cycles due reaching said particular value less than 0, said particular value being a predetermined low water mark value.

7. A method according to claim 5, wherein said step of burst refreshing comprises a step of terminating said burst refresh in response to a preemption request received for access to said memory.

8. A method according to claim 1, wherein said predetermined average rate is a fixed rate.

9. A method according to claim 1, wherein said memory has a plurality of memory banks, each of said banks having a respective RAS# input and a respective CAS# input and supporting a CAS#-before-RAS# refresh command, wherein said step of burst refreshing said memory comprises the steps of:
   asserting the CAS# input to all of said banks; and
   asserting the RAS# input to all of said banks in a staggered manner.

10. A method for managing refreshes of a dynamic memory, comprising the steps of:
    maintaining a count indicating a number of refresh cycles due;
    increasing said count at a predetermined nominal rate;
    requesting access to said memory in response to said number of refresh cycles due reaching a predetermined high water mark value N, N>1;
    at a first time in response to said access request, when the number of said refresh cycles due is N+n, n>=0, beginning a burst refresh of said memory;
    decrementing said count in conjunction with each refresh cycle performed in said burst refresh; and
    terminating said burst refresh when the number of refresh cycles due reaches a value −m, where m>0.

11. A method according to claim 10, wherein said step of terminating said burst refresh occurs in response to a preemption request received for access to said memory.

12. A method according to claim 10, wherein said step of terminating said burst refresh occurs in response to said number of refresh cycles due reaching a predetermined low water mark value (−M).

13. Refresh control apparatus for use with a dynamic memory and with, a refresh timing signal, comprising:
    counting circuitry which maintains a refresh count indicating a number of refresh cycles due, said counting circuitry increasing said refresh count in response to each assertion of said refresh timing signal and decrementing said refresh count in conjunction with each refresh cycle performed; and
    burst refresh circuitry which performs a burst of at least one of said refresh cycles in response to said number of refresh cycles due reaching a predetermined high value;
    wherein said burst refresh circuitry is able to continue performing at least one additional refresh cycle of said burst after said number of refresh cycles due reaches zero.

14. Apparatus according to claim 13, wherein said number of refresh cycles due is given by said refresh count minus a predetermined nonzero value M.

15. Apparatus according to claim 13, wherein said burst refresh circuitry comprises:
    burst refresh request circuitry which requests control of said memory in response to said number of refresh cycles due reaching said predetermined high value;
    burst refresh performance circuitry which performs said burst of refresh cycles in response to assertion of a burst refresh grant signal; and
    burst refresh termination circuitry which terminates said burst refresh in response to occurrence of at least one event in a predefined set of at least one termination event.

16. Apparatus according to claim 15, wherein said predefined set of termination events includes said number of refresh cycles due reaching a predetermined low value −M.

17. Apparatus according to claim 16, wherein said predetermined set of termination events further includes preemption of said burst by another agent.

18. Apparatus according to claim 16, wherein said counting circuitry includes a counter having a count output carrying said refresh count, said number of refresh cycles due being given by said refresh count minus M;
    further comprising initialization circuitry which initializes said counting circuitry to M in response to a system reset.

19. Apparatus according to claim 15, wherein said predetermined set of termination events includes preemption of said burst by another agent.

* * * * *

UNITED STATES PATENT AND TRADEMARK OFFICE
CERTIFICATE OF CORRECTION

PATENT NO.  : 5,907,857
DATED       : May 25, 1999
INVENTOR(S) : Sukalpa Biswas

It is certified that error appears in the above-identified patent and that said Letters Patent is hereby corrected as shown below:

Claim 13, col. 18, line 2, after "with", delete ",".
Claim 13, col. 18, line 11, after "value", change ";" to --,--
Claim 18, col. 18, line 40, after "M", change ";" to --,--.

Signed and Sealed this

Eighteenth Day of January, 2000

Attest:

Attesting Officer

Q. TODD DICKINSON

Commissioner of Patents and Trademarks

UNITED STATES PATENT AND TRADEMARK OFFICE
CERTIFICATE OF CORRECTION

PATENT NO. : 5,907,857
DATED : May 25, 1999
INVENTOR(S) : Sukalpa Biswas

It is certified that error appears in the above-identified patent and that said Letters Patent is hereby corrected as shown below:

Claim 1, col. 16, line 45 and line 48, delete "first".
Claim 1, col. 16, line 46, insert --dynamic-- after "said".
Claim 3, col. 16, line 54, change "the" to --a--.
Claim 4, col. 16, line 61, delete "first".
Claim 13, col. 18, line 2, after "with", delete ",".
Claim 13, col. 18, line 11, after "value", change ";" to --,--
Claim 18, col. 18, line 40, after "M", change ";" to --,--.

Signed and Sealed this

Thirty-first Day of October, 2000

Attest:

Q. TODD DICKINSON

*Attesting Officer*  *Director of Patents and Trademarks*